(12) United States Patent
Mandel et al.

(10) Patent No.: US 12,550,296 B2
(45) Date of Patent: Feb. 10, 2026

(54) MULTI-STAGE VAPOR-VENTING MANIFOLD-MICROCHANNEL HEAT SINK, AND SYSTEMS AND METHODS FOR USE THEREOF

(71) Applicant: UNIVERSITY OF MARYLAND, COLLEGE PARK, College Park, MD (US)

(72) Inventors: Raphael Kahat Mandel, Washington, DC (US); Michael M. Ohadi, Clarksville, MD (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 310 days.

(21) Appl. No.: 18/105,498

(22) Filed: Feb. 3, 2023

(65) Prior Publication Data

US 2023/0284418 A1    Sep. 7, 2023

Related U.S. Application Data

(60) Provisional application No. 63/267,525, filed on Feb. 3, 2022.

(51) Int. Cl.
*H05K 7/20* (2006.01)

(52) U.S. Cl.
CPC ....... *H05K 7/2039* (2013.01); *H05K 7/20318* (2013.01); *H05K 7/20327* (2013.01)

(58) Field of Classification Search
CPC ............. H05K 7/2039; H05K 7/20318; H05K 7/20327; H05K 7/2029; H05K 7/20254; H05K 5/068; H01L 23/473; H01L 23/427
See application file for complete search history.

(56) References Cited

U.S. PATENT DOCUMENTS 6,898,082 B2    5/2005   Dessiatoun et al.
6,986,382 B2    1/2006   Upadhya et al.
(Continued)

OTHER PUBLICATIONS

Arie et al., "Numerical Modeling and Thermal Optimization of a Single-Phase Flow Manifold-Microchannel Plate Heat Exchanger," *International Journal of Heat and Mass Transfer*, 2015, 81: pp. 478-489. (12 pages).

(Continued)

*Primary Examiner* — Eric S Ruppert
*Assistant Examiner* — Kamran Tavakoldavani
(74) *Attorney, Agent, or Firm* — RowanTree Law Group, PLLC; Frederick F. Rosenberger

(57) ABSTRACT

A manifold-microchannel (MMC) heat sink can comprise a plurality of microchannels and a manifold. The microchannels can be segregated into successive heat transfer stages. The manifold can include at least one connecting channel and at least one vapor permeable membrane portion. Each connecting channel can fluidically couple one of the heat transfer stages to a successive heat transfer stage. Each vapor permeable membrane portion can allow coolant in a vapor phase to pass therethrough while retaining coolant in a liquid phase within the corresponding connecting channel. A vapor quality of the coolant exiting from one of the heat transfer stages into a connecting channel can be greater than a vapor quality of the coolant entering the successive heat transfer stage from the same connecting channel.

20 Claims, 8 Drawing Sheets

(56) References Cited

U.S. PATENT DOCUMENTS

| | | | |
|---|---|---|---|
| 6,994,151 B2 | 2/2006 | Zhou et al. | |
| 9,078,379 B2 | 7/2015 | Campbell et al. | |
| 2003/0085024 A1* | 5/2003 | Santiago | B01D 61/427 257/E23.098 |
| 2007/0034356 A1* | 2/2007 | Kenny | F04B 17/00 257/E23.098 |
| 2013/0027883 A1* | 1/2013 | Campbell | H05K 7/20318 165/185 |
| 2016/0288279 A1* | 10/2016 | Campbell | G06F 1/20 |
| 2017/0092565 A1* | 3/2017 | Chen | H05K 7/20281 |

OTHER PUBLICATIONS

Cetegen, Edvin, "Force Fed Microchannel High Heat Flux Cooling Utilizing Microgrooved Surfaces," PhD Dissertation, University of Maryland, College Park (College Park, Maryland), 2010. (311 pages).

David et al., "Hydraulic and Thermal Characteristics of a Vapor Venting Two-Phase Microchannel Heat Exchanger," *International Journal of Heat and Mass Transfer*, 2011, 54: pp. 5504-5516. (13 pages).

Drummond et al., "A Hierarchical Manifold Microchannel Heat Sink Array for High-Heat-Flux Two-Phase Cooling of Electronics," *International Journal of Heat and Mass Transfer*, 2018, 117: pp. 319-330. (12 pages).

Drummond et al., "Evaporative Intrachip Hotspot Cooling with a Hierarchical Manifold Microchannel Heat Sink Array," *2016 15th IEEE Intersociety Conference on Thermal and Thermomechanical Phenomena in Electronic Systems (ITherm)*, May 2016, pp. 307-315. (9 pages).

Drummond, Kevin P., "Characterization of Manifold Microchannel Heat Sinks During Two-Phase Operation," PhD Dissertation, Purdue University (West Lafayette, Indiana), May 2018. (203 pages).

Mandel et al., "A "2.5-D" Modeling Approach for Single-Phase Flow and Heat Transfer in Manifold Microchannels, *International Journal of Heat and Mass Transfer*," Nov. 2018, 126(A): pp. 317-330. (42 pages).

Mandel et al., "A Heat Spreading Model for Double-Sided, Cross-Flow, Manifold-Microchannel Heat Exchangers," *2018 17th IEEE Intersociety Conference on Thermal and Thermomechanical Phenomena in Electronic Systems (ITherm)*, 2018, pp. 147-155. (9 pages).

Mandel et al., "Embedded Two-Phase Cooling of High Flux Electronics Via Press-Fit and Bonded FEEDS Coolers," *Journal of Electronic Packaging*, Sep. 2018, 130:031003. (10 pages).

Palko et al., "High Heat Flux Two-Phase Cooling of Electronics with Integrated Diamond/Porous Copper Heat Sinks and Microfluidic Coolant Supply," *2016 15th IEEE Intersociety Conference on Thermal and Thermomechanical Phenomena in Electronic Systems (ITherm)*, 2016, pp. 1511-1517. (7 pages).

\* cited by examiner

MULTI-STAGE VAPOR-VENTING MANIFOLD-MICROCHANNEL HEAT SINK, AND SYSTEMS AND METHODS FOR USE THEREOF

CROSS-REFERENCE TO RELATED APPLICATION

The present application claims the benefit of U.S. Provisional Application No. 63/267,525, filed Feb. 3, 2022, entitled "Multi-Stage, Vapor Venting Manifold Microchannel Heat Sink," which is incorporated by reference herein in its entirety.

FIELD

The present disclosure relates generally to thermal management, and more particularly, to manifold microchannel heat sinks, and systems and methods for use thereof.

BACKGROUND

Due to their high surface area to volume ratio, microchannels can greatly enhance heat transfer efficiency when employed in a heat sink. However, due to their small hydraulic diameter, the microchannels exhibit an increased pressure drop, which in turn requires higher pumping power rates. To achieve a higher heat transfer rate (heat transfer coefficient) while reducing pressure drop (thereby resulting in low pumping power), manifold-microchannel (MMC) heat sinks have been employed. In such heat sinks, the microchannels 304 are divided into a system of parallel channels using a manifold 306 as flow divider, for example, as shown by MMC heat sink 302 in FIG. 3A. A portion of the manifold 306 defines a common inlet channel 310 extending across multiple microchannels 304 of the parallel array, while another portion of the manifold 306 defines a common outlet channel 316 extending across the same microchannels 306.

To improve performance of an MMC heat sink, such as MMC heat sink 302, two-phase cooling can be used. Two-phase cooling can provide numerous benefits over single-phase liquid cooling. For example, the use of latent heat to absorb energy can yield a reduction in the coolant flowrates required, and thus a reduction in the pumping power required. Alternatively or additionally, two-phase cooling may achieve higher heat transfer coefficients associated with coolant flow boiling and thin film evaporation. However, when using MMC heat sink 302 to provide two-phase cooling, the vapor quality can increase as the coolant evaporates within the system, thereby reducing the heat transfer coefficient and undermining the desired high heat removal rates.

While conventional two-phase microchannels (e.g., without an MMC configuration) can operate at high vapor qualities, the pressure drops associated with such microchannels are higher and the heat transfer coefficients are lower as compared to that for MMC heat sinks. Conversely, conventional MMC heat sinks have lower pressure drops and higher heat transfer coefficients, as compared to that for two-phase microchannels, but they are limited in their ability to obtain high vapor qualities.

Embodiments of the disclosed subject matter may address one or more of the above-noted problems and disadvantages, among other things.

SUMMARY

Embodiments of the disclosed subject matter enable manifold-microchannel (MMC) heat sinks to operate at high vapor qualities (e.g., ≥25%, such as at least 50%). In some embodiments, a plurality of microchannels can be segregated into multiple heat transfer stages and coupled to a manifold. A vapor permeable membrane of the manifold can be used to remove vapor in a coolant flow exiting from the heat transfer stages prior to entering a successive heat transfer stage, thereby resetting a vapor quality of the coolant flow. In some embodiments, by removing vapor at each heat transfer stage, the overall exit vapor quality can be increased and the heat transfer efficiency can be improved. In some embodiments, the addition of multi-stage vapor management can enable higher heat transfer coefficients and/or higher heat removal rates, while delivering higher exit vapor qualities than conventional MMC heat sinks and thus better utilization of the refrigerant charge in the system.

In one or more embodiments, a system can comprise a manifold-microchannel (MMC) heat sink. The MMC heat sink can comprise a plurality of microchannels and a manifold. The plurality of microchannels can be constructed to carry a flow of coolant therein. The manifold can be coupled to the plurality of microchannels so as to segregate the microchannels into successive heat transfer stages. The manifold can comprise at least one inlet channel, at least one outlet channel, at least one connecting channel, and at least one vapor permeable membrane portion. The at least one inlet channel can be coupled to a first of the heat transfer stages. The at least one outlet channel can be coupled to a second of the heat transfer stages. Each connecting channel can fluidically couple one of the heat transfer stages to a successive one of the heat transfer stages. Each vapor permeable membrane portion can be fluidically coupled to a corresponding one of the at least one connecting channel and can be constructed to allow the coolant in a vapor phase to pass therethrough while retaining the coolant in a liquid phase within the corresponding one of the at least one connecting channel. The MMC heat sink can be constructed such that a vapor quality of the coolant exiting from one of the heat transfer stages into a respective one of the at least one connecting channel is greater than a vapor quality of the coolant entering the successive one of the heat transfer stages from the respective one of the at least one connecting channel.

In one or more embodiments, a method can comprise flowing coolant in a liquid phase to a heat transfer stage of a manifold-microchannel (MMC) heat sink. The MMC heat sink can comprise a plurality of microchannels segregated into successive heat transfer stages and a manifold coupled to the plurality of microchannels. The method can further comprise heating the coolant within one or more microchannels of the heat transfer stage so as to convert at least some of the coolant therein into a vapor phase. The method can also comprise flowing the coolant from the heat transfer stage into a connecting channel of the manifold, the coolant from the heat transfer stage having a first vapor quality. The method can further comprise removing, via a vapor permeable membrane portion fluidically coupled to the connecting channel, at least some of the coolant in the vapor phase from the connecting channel such that the coolant remaining in the connecting channel has a second vapor quality less than the first vapor quality. The method can also comprise flowing the coolant from the connecting channel of the manifold into a next heat transfer stage of the MMC heat sink. The method can further comprise heating the coolant within one or more microchannels of the next heat transfer stage so as to convert at least some of the coolant therein into the vapor phase.

Any of the various innovations of this disclosure can be used in combination or separately. This summary is provided to introduce a selection of concepts in a simplified form that are further described below in the detailed description. This summary is not intended to identify key features or essential features of the claimed subject matter, nor is it intended to be used to limit the scope of the claimed subject matter. The foregoing and other objects, features, and advantages of the disclosed technology will become more apparent from the following detailed description, which proceeds with reference to the accompanying figures.

BRIEF DESCRIPTION OF THE DRAWINGS

Embodiments will hereinafter be described with reference to the accompanying drawings, which have not necessarily been drawn to scale. Where applicable, some elements may be simplified or otherwise not illustrated in order to assist in the illustration and description of underlying features. Throughout the figures, like reference numerals denote like elements.

DETAILED DESCRIPTION

General Considerations

Figure 1A:
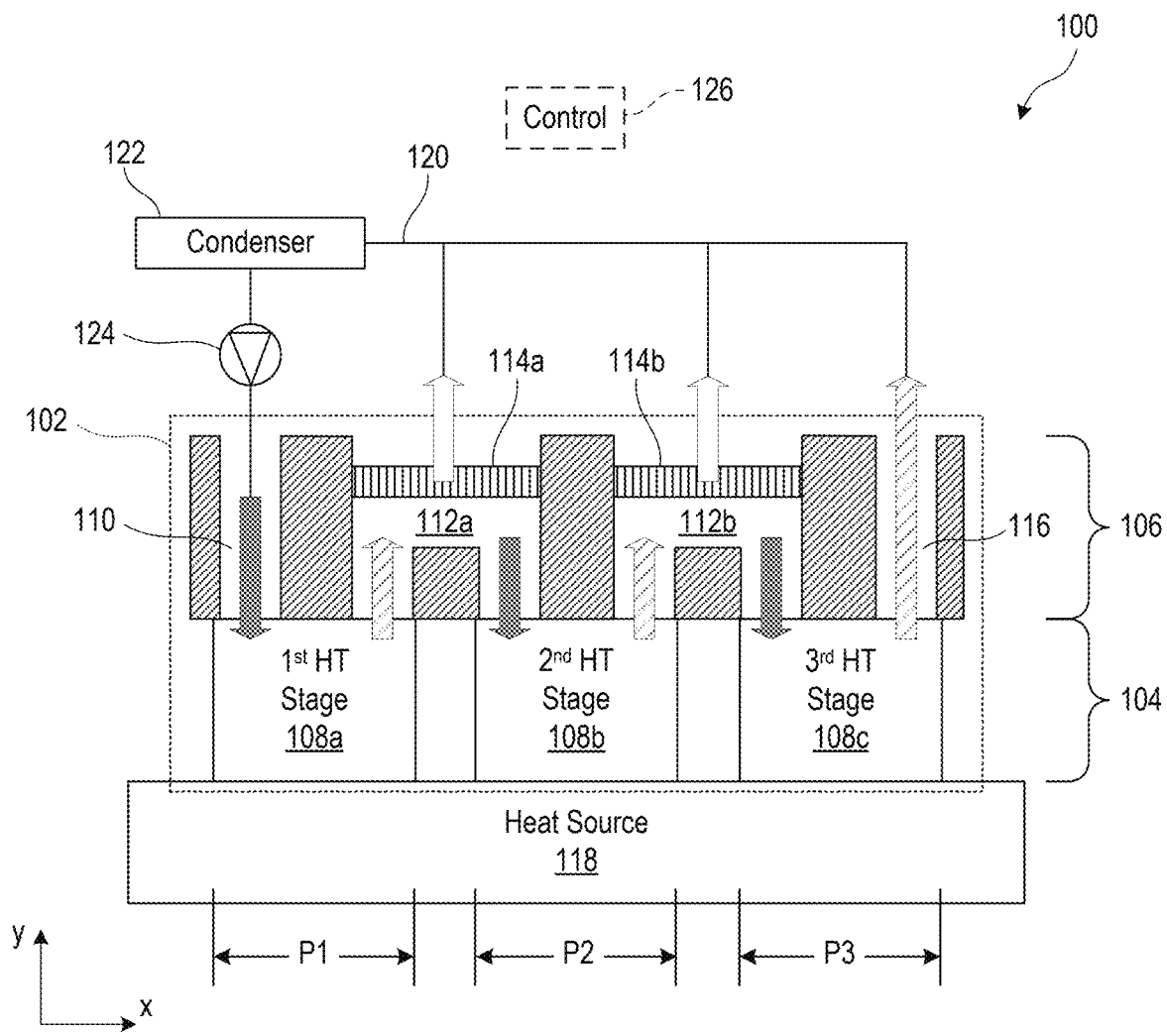
FIG. 1A is a simplified schematic diagram of a cooling system employing a multi-stage vapor-venting manifold-microchannel (MMC) heat sink, according to one or more embodiments of the disclosed subject matter.

For purposes of this description, certain aspects, advantages, and novel features of the embodiments of this disclosure are described herein. The disclosed methods and systems should not be construed as being limiting in any way. Instead, the present disclosure is directed toward all novel and nonobvious features and aspects of the various disclosed embodiments, alone and in various combinations and subcombinations with one another. The methods and systems are not limited to any specific aspect or feature or combination thereof, nor do the disclosed embodiments require that any one or more specific advantages be present, or problems be solved. The technologies from any embodiment or example can be combined with the technologies described in any one or more of the other embodiments or examples. In view of the many possible embodiments to which the principles of the disclosed technology may be applied, it should be recognized that the illustrated embodiments are exemplary only and should not be taken as limiting the scope of the disclosed technology.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one skilled in the art.

The disclosure of numerical ranges should be understood as referring to each discrete point within the range, inclusive of endpoints, unless otherwise noted. Unless otherwise indicated, all numbers expressing quantities of components, molecular weights, percentages, temperatures, times, and so forth, as used in the specification or claims are to be understood as being modified by the term "about." Accordingly, unless otherwise implicitly or explicitly indicated, or unless the context is properly understood by a person skilled in the art to have a more definitive construction, the numerical parameters set forth are approximations that may depend on the desired properties sought and/or limits of detection under standard test conditions/methods, as known to those skilled in the art. When directly and explicitly distinguishing embodiments from discussed prior art, the embodiment numbers are not approximates unless the word "about" is recited. Whenever "substantially," "approximately," "about," or similar language is explicitly used in combination with a specific value, variations up to and including 10% of that value are intended, unless explicitly stated otherwise.

Directions and other relative references may be used to facilitate discussion of the drawings and principles herein but are not intended to be limiting. For example, certain terms may be used such as "inner," "outer," "upper," "lower," "top," "bottom," "interior," "exterior," "left," right," "front," "back," "rear," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" part can become a "lower" part simply by turning the object over. Nevertheless, it is still the same part, and the object remains the same.

As used herein, "comprising" means "including," and the singular forms "a" or "an" or "the" include plural references unless the context clearly dictates otherwise. The term "or" refers to a single element of stated alternative elements or a combination of two or more elements unless the context clearly indicates otherwise.

Although there are alternatives for various components, parameters, operating conditions, etc. set forth herein, that does not mean that those alternatives are necessarily equivalent and/or perform equally well. Nor does it mean that the alternatives are listed in a preferred order, unless stated otherwise. Unless stated otherwise, any of the groups defined below can be substituted or unsubstituted.

Unless explained otherwise, all technical and scientific terms used herein have the same meaning as commonly understood to one skilled in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Features of the presently disclosed subject matter will be apparent from the following detailed description and the appended claims.

Overview of Terms

The following are provided to facilitate the description of various aspects of the disclosed subject matter and to guide those skilled in the art in the practice of the disclosed subject matter.

Microchannel: A channel configured for flow of coolant therethrough having a minimum dimension in a cross-section perpendicular to a desired direction of coolant flow. In some embodiments, the minimum cross-sectional dimension (e.g., width, W, in FIG. 1B) can be less than or equal to 1 mm, for example, less than or equal to 100 µm. For example, the minimum cross-sectional dimension can be in a range of 20-40 µm, inclusive. In some embodiments, the channel can also have a maximum dimension in a cross-section perpendicular to the desired direction of coolant flow. For example, the maximum cross-sectional dimension (e.g., height, H, in FIG. 1B) can be at least 10 times (e.g., in range of 10-20 times, inclusive) of the minimum cross-sectional dimension. In some embodiments, the channel can also have a dimension along the desired direction of coolant flow. For example, the dimension along the desired direction of coolant flow can be at least 10 times of the maximum cross-sectional dimension. In some embodiments, a plurality of microchannels are provided together in a manifold-microchannel (MMC) heat sink, for example, a parallel array of microchannels.

Heat Transfer Stage: One or more microchannels grouped together and sharing common inlet, outlet, and/or connecting channels of a manifold coupled thereto. In some embodiments, an array of microchannels can be segregated into multiple successive heat transfer stages, for example, at least in part by the manifold coupled thereto. In some embodiments, a heat transfer stage can include a single microchannel of the array. Alternatively or additionally, in some embodiments, a heat transfer stage can include multiple microchannels of the array.

Pitch: A size of a respective heat transfer stage. In some embodiments, the pitch is along a direction perpendicular to a direction of coolant flow within the microchannel(s) of the heat transfer stage. In some embodiments, the pitch can be based on a size of the microchannel(s) (e.g., width) within the heat transfer stage and/or a number of microchannels with the heat transfer stage. For example, in some embodiments, the pitch can be set by a size of channels of the manifold that define the heat transfer stage and connect to the microchannel(s) therein.

Overall Exit Vapor Quality: A vapor quality (e.g., the mass fraction in a saturated mixture that is vapor) of the coolant flow output from the entire MMC heat sink, including any vapor extracted between successive heat transfer stages and the heated coolant from the ultimate heat transfer stage. In some embodiments, the overall exit vapor quality can be measured at or within a combined outlet channel from the MMC heat sink. Alternatively or additionally, in some embodiments, the overall exit vapor quality can be measured at or just prior to an inlet of a condenser coupled to the MMC heat sink. In some embodiments, the overall exit vapor quality can be at least 25%, for example, at least 50%. Conversely, in some embodiments, the vapor quality of coolant exiting each heat transfer stage can be less than the overall exit vapor quality. For example, in some embodiments, the vapor quality exiting from each heat transfer stage can be in a range of 5-25%, inclusive.

Introduction

Disclosed herein are systems employing a multi-stage, vapor-venting manifold-microchannel (MMC) heat sink and methods for provision and use thereof. In some embodiments, a manifold coupled to a plurality of microchannels can segregate the microchannels into successive heat transfer stages, and vapor in heated coolant transferred between the successive stages can be removed via a vapor permeable membrane. In some embodiments, the vapor removal can reset a vapor quality of the coolant flow (e.g., to be less than 5%, for example, about 0%) input to each heat transfer stage. In some embodiments, the use of multiple heat transfer stages together with the vapor removal between stages can yield operation at higher overall exit vapor qualities (e.g., ≥25%, such as at least 50%) and thus heat transfer efficiencies than were otherwise achievable with conventional MMC heat sinks. Such high efficiency two-phase cooling can reduce the size of thermal management systems, for example, the amount of coolant required and/or pumping power requirements. In some embodiments, multi-stage vapor management (e.g., as disclosed herein) can achieve high heat transfer coefficients and high heat removal rates, while delivering high exit vapor qualities, thus offering better utilization of refrigerant charge within the system.

Cooling Systems with MMC Heat Sink

FIG. 1A illustrates a generalized cooling system 100 employing a multi-stage, vapor-venting MMC heat sink 102. In the illustrated example, the cooling system 100 can include a condenser 122, a pump 124, and a controller 126 operatively coupled to the condenser 122 and/or the pump 124 for controlling operation thereof (e.g., to change coolant flow rate provided to the MMC heat sink 102 in response to a heating load generated by heat source 118). The condenser can condense coolant in the vapor phase and/or reduce a temperature of coolant in the liquid phase directed from the MMC heat sink 102, for example, via common outlet line 120. However, other configurations and/or fewer or additional components for the cooling system 100 are also possible according to one or more contemplated embodiments.

The MMC heat sink 102 can include a plurality of microchannels 104 and a manifold 106 fluidically coupled to the plurality of microchannels 104. Each microchannel can be constructed to carry a flow of coolant therein. The manifold 106 can segregate the microchannels 104 into multiple successive heat transfer stages, for example, three heat transfer stages 108a-108c in FIG. 1A. Each heat transfer stage 108a-108c can be formed by at least one microchannel 104. For example, in some embodiments, one, some, or all of the heat transfer stages 108a-108c can be formed by multiple microchannels 104 (e.g., microchannels that are adjacent to each other along the x-direction). In some embodiments, a pitch (e.g., P1-P3) of each heat transfer stage 108a-108c can be substantially the same. Alternatively, in some embodiments, the pitch of at least one heat transfer stage 108a-108c is different from at least another of the heat transfer stages 108a-108c, for example, to yield a substantially constant mass flux flowing through each heat transfer stage and/or to address higher heat flux regions of heat source 118.

In some embodiments, the manifold 106 can include a plurality of channels therein, for example, to direct coolant flow to, from, and/or between the heat transfer stages 108a-108b. In the illustrated example of FIG. 1A, the manifold 106 has one or more inlet channels 110 that direct an inlet coolant flow, for example, from condenser 122 to the first heat transfer stage 108a. In the illustrated example of FIG. 1A, the manifold 106 also has one or more outlet channels 116 that direct an outlet coolant flow, for example, from the third heat transfer stage 108c to the condenser 122. Alternatively or additionally, the manifold 106 can also include one or more connecting channels that direct an outlet from one of the heat transfer stages to a next successive heat transfer stage. In the illustrated example of FIG. 1A, the manifold 106 has one or more first connecting channels 112a that fluidically couple together the first heat transfer stage 108a and the second heat transfer stage 108b, and one or more second connecting channels 112b that fluidically couple together the second heat transfer stage 108b and the third heat transfer stage 108c.

Figure 2A:
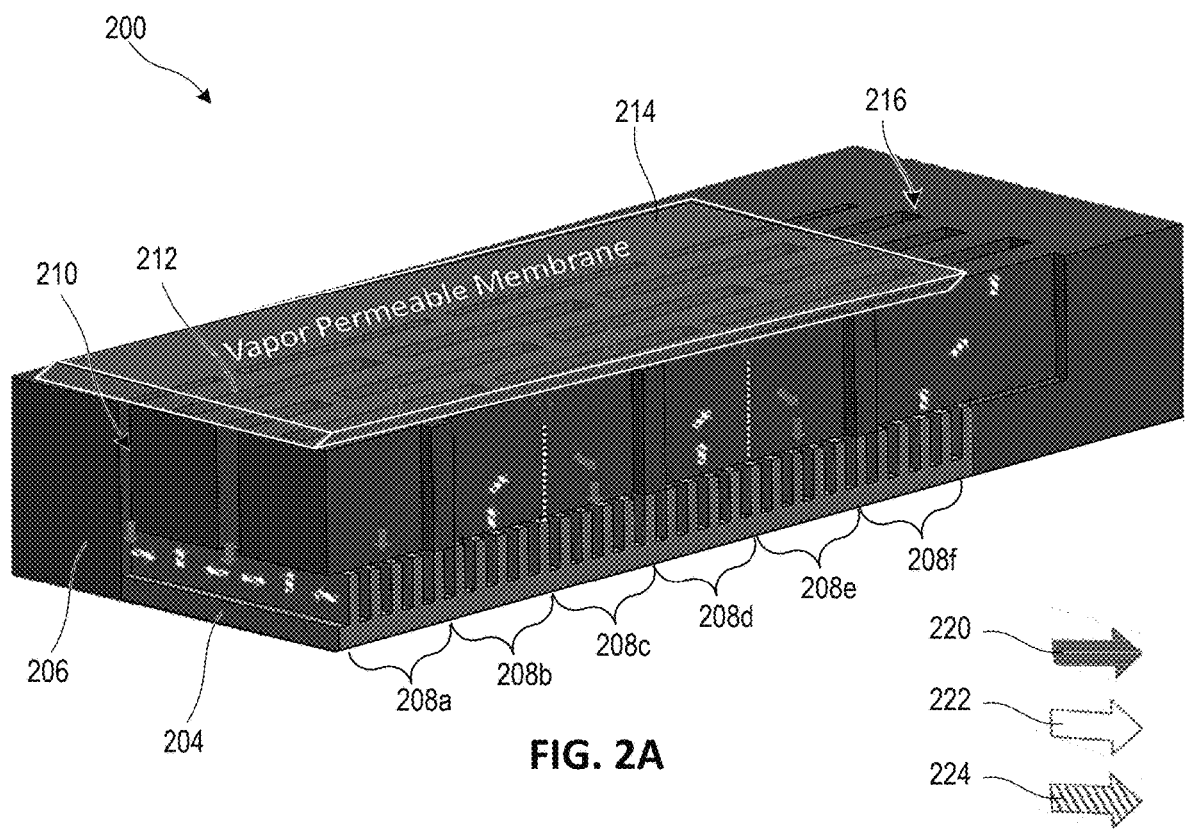
FIG. 2A is a partial cutaway perspective view of a multi-stage vapor-venting MMC heat sink, according to one or more embodiments of the disclosed subject matter.

In the illustrated example of FIG. 1A, each connecting channel 112a, 112b can include a respective vapor-permeable membrane 114a, 114b. Alternatively or additionally, in some embodiments, one, some, or all of the connecting channels can include a respective portion of a shared vapor-permeable membrane (e.g., as shown in FIG. 2A). Each vapor-permeable membrane 114a, 114b (or portion thereof) can allow coolant in the vapor phase to pass therethrough while otherwise retaining coolant in the liquid phase within the respective connecting channel 112a, 112b. In some embodiments, the vapor-permeable membrane can comprise one of the vapor venting membrane configurations disclosed in David et al., "Hydraulic and thermal characteristics of a vapor venting two-phase microchannel heat exchanger," *International Journal of Heat and Mass Transfer,* 2011, 54: pp. 5504-16, which vapor venting membrane configurations are incorporated by reference herein. Alternatively or additionally, the vapor-permeable membrane can comprise one of the phase separation membrane configurations disclosed in Palko et al., "High Heat Flux Two-Phase Cooling of Electronics with Integrated Diamond/Porous Copper Heat Sinks and Microfluidic Coolant Supply," 15$^{th}$ *Intersociety Conference on Thermal and Thermomechanical Phenomena in Electronic Systems,* May 2016, pp. 1511-17, and/or one of the vapor permeable membrane configurations disclosed in U.S. Pat. No. 6,994,151, issued Feb. 7, 2006, which phase separation and vapor permeable membrane configurations are incorporated by reference herein.

In operation, coolant in the liquid phase (e.g., having a vapor quality ≤5%, for example, about 0%) is provided to first heat transfer stage 108a via inlet channel(s) 110 of the manifold 106. The coolant flowing through the microchannel(s) 104 of the first heat transfer stage 108a is heated by heat from heat source 118, thereby raising a temperature of the coolant in the liquid phase and/or converting at least some of the coolant into vapor. The coolant (e.g., having a vapor quality in a range of 5-25%) is then directed from the first heat transfer stage 108a via connecting channel(s) 112a of the manifold 106. Within the connecting channel(s) 112a, at least some of the vapor can be removed from the flowing coolant via the vapor permeable membrane 114a, thereby reducing the vapor quality of the coolant (e.g., having a vapor quality ≤5%, for example, about 0%) entering the second heat transfer stage 108b from the connecting channel(s) 112a.

Similarly, the coolant flowing through the microchannel(s) 104 of the second heat transfer stage 108b is heated by heat from heat source 118 thereby raising a temperature of the coolant in the liquid phase and/or converting at least some more of the coolant into vapor. The coolant (e.g., having a vapor quality in a range of 5-25%) is then directed from the second heat transfer stage 108b via connecting channel(s) 112b of the manifold 106. Within the connecting channel(s) 112b, at least some of the vapor can be removed from the flowing coolant via the vapor permeable membrane 114b, thereby reducing the vapor quality of the coolant (e.g., having a vapor quality ≤5%, for example, about 0%) entering the third heat transfer stage 108b from the connecting channel(s) 112a.

Finally, the coolant flowing through the microchannel(s) 104 of the third heat transfer stage 108c is heated by heat from heat source 118 thereby raising a temperature of the coolant in the liquid phase and/or converting at least some more of the coolant into vapor. The coolant (e.g., having a vapor quality in a range of 5-25%) is then directed from the third heat transfer stage 108c via outlet channel(s) 116 of the manifold 106. In some embodiments, the vapor removed via vapor-permeable membranes 114a, 114b and the coolant in outlet channel(s) 116 can be combined in common outlet line 120, for example, for introduction to condenser 122 for recirculation back to the MMC heat sink 102. The use of the vapor-permeable membrane 114a, 114b between each heat transfer stage 108a-108c can be effective to reset the inlet vapor quality for each stage (e.g., to have a vapor quality ≤5%, for example, about 0%). In some embodiments, the resetting of the vapor quality can enable optimal, or at least improved, operational conditions to be met while also achieving high overall exit vapor qualities (e.g., as measured in common outlet line 120). For example, in some embodiments, the overall exit vapor quality can be at least 25%, such as at least 50% (e.g., at least 60%). In contrast, existing MMC heat sinks employing a single heat transfer stage are generally limited to exit vapor qualities of less than 20%.

Although only three stages are shown in FIG. 1A, embodiments of the disclosed subject matter are not limited thereto. Indeed, any number of stages greater than two (e.g., four or more) is possible according to one or more contemplated embodiments. Indeed, in some embodiments, the number of stages can be selected based on the heat transfer requirements in a particular application, for example, with a greater number of stages 108 potentially yielding a higher wall heat transfer coefficient and/or higher overall exit vapor quality. In some embodiments, the MMC heat sink 102 and/or the cooling system 100 can be configured to provide the performance targets in Table 1 below.

TABLE 1

Exemplary Performance Targets for a
Cooling System Employing an MMC Heat Sink

| Metric | Target |
| --- | --- |
| Total thermal resistance | 0.04 K/W |
| Effective heat transfer coefficient (HTC) | 300-400 kW/m$^2$-K |
| Coefficient of performance (COP) | ≥100, e.g., ≥200 |
| Package-level heat density | ≥100 kW/L |
| Chip-level heat flux | ≥100 W/cm$^2$, e.g., ≥1 kW/cm$^2$ |
| Hot-spot-level heat flux | ≥1 kW/cm$^2$, e.g., ≥5 kW/cm$^2$ |
| Overall exit vapor quality | ≥25%, e.g., ≥50% |

In some embodiments, the MMC heat sink 102 can be thermally coupled to heat source 118, for example, via direct contact or indirect contact (e.g., with one or more intervening members) between heat source 118 and microchannels 104 (e.g., a base microchannel surface) in the MMC heat sink 102. For example, the heat source 118 can comprise one or more computer chips, one or more integrated circuit dies, one or more printed circuit boards, or any combination thereof. In some embodiments, the heat source 118 can include multiple heat sources with different heat flux requirements. In some embodiments, the pitch of the heat transfer stages 108a-108c, the location of heat transfer stages 108a-108c, and/or the configuration of the manifold can be adapted to address these different heat flux requirements.

For example, in some embodiments, the MMC heat sink 102 can be employed to cool heterogenous three-dimensional (3-D) integration of electronics (e.g., different devices, such as but not limited to a complementary metal-oxide-semiconductor (CMOS) processor and a memory). In such heterogeneous integration, packaging technology can be used to integrate different chips or components with different wafer sizes and/or feature sizes on different substrates or individually, which can result in different heat flux levels for various chips sitting in close proximity of each other. In some embodiments, the MMC heat sink 102 can be used to provide optimum, or least improved, distribution and management of liquid and vapor coolant flows to/from such components.

Figure 1B:
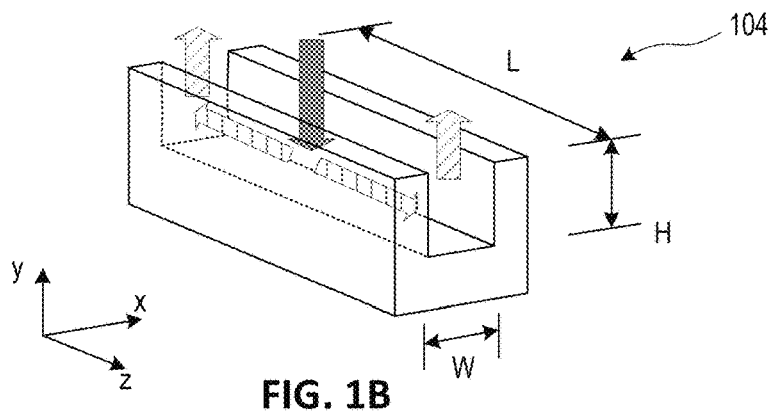
FIG. 1B is a simplified perspective view of a microchannel for use in an MMC heat sink, according to one or more embodiments of the disclosed subject matter.

In some embodiments, one, some, or all of the microchannels 104 can have a rectangular cross-section, for example, as illustrated in FIG. 1B. Other channel geometries are also possible, such as but not limited to offset strip fin, pin-fin, rib, circular, semi-circular, elliptical, semi-elliptical, trapezoidal, hexagonal, and T-shape. In the illustrated example, the microchannel 104 has (i) a width, W, along the x-direction, (ii) a height, H, along the y-direction, and (iii) a length, L, along the z-direction. In some embodiments, the coolant flow within the microchannel 104 (e.g., to effect heat transfer) can be along a direction substantially parallel to the z-direction. Alternatively or additionally, in some embodiments, the coolant flow into or out of the microchannel 104 can be along a direction in a plane perpendicular to the z-direction (e.g., substantially along the y-direction). In some embodiments, the height, H, can be 10-20 times greater than the width, W. The dimensions of the microchannel can be adapted to a particular heat transfer application, for example, with more demanding heat loads employing smaller width microchannels. In some embodiments, the width, W, of the microchannel is less than or equal to 1 mm, for example, less than or equal to 100 μm (e.g., in a range of 20-40 μm, inclusive).

Figure 1C:
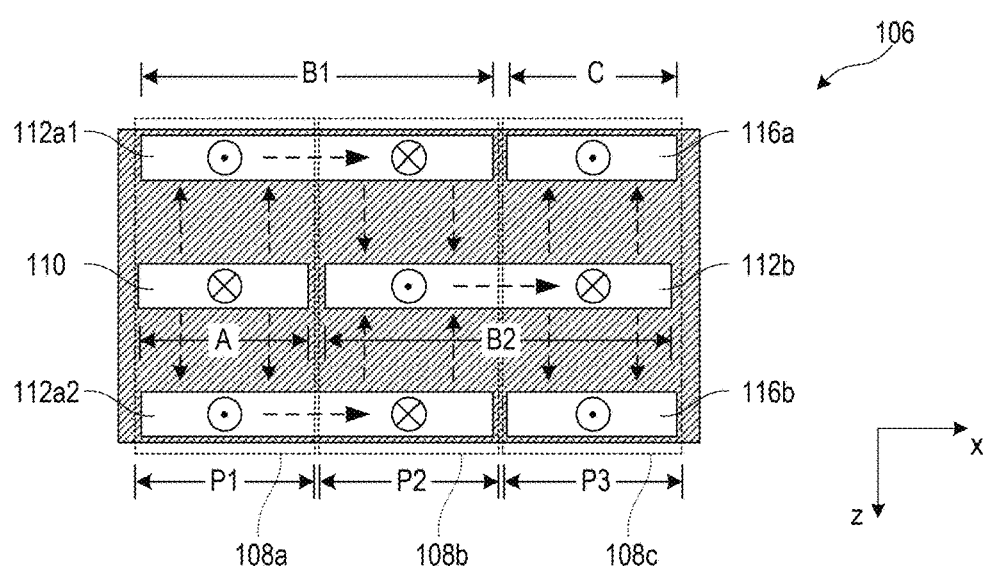
FIG. 1C is a simplified plan view of a manifold for use in an MMC heat sink, according to one or more embodiments of the disclosed subject matter.

In FIG. 1A, the inlet channel(s) 110, the connecting channels 112a-112b, and the outlet channel(s) 116 are shown offset from each other with respect to the x-direction for simplicity of illustration. However, in some embodiments, the channels of the manifold connected to a common heat transfer stage may actually overlap along the x-direction while being offset from each other along the z-direction. For example, FIG. 1C shows such a channel configuration for a manifold 106. In the illustrated example of FIG. 1C, an inlet channel 110 provides coolant to the first heat transfer stage 108a, which coolant flows through the microchannel(s) therein along the z-direction to exit the first heat transfer stage 108a via a pair of connecting channels 112a1, 112a2 at opposite ends of the first heat transfer stage 108a. The connecting channels 112a1, 112a2 each transfer coolant to opposite ends of the second heat transfer stage 108b, where it follows along the z-direction toward the center and exits the second heat transfer stage 108b via single connecting channel 112b. Similar to operation of the first heat transfer stage 108a, the connecting channel 112b then transfers coolant to the third heat transfer stage 108c, which coolant flows through the microchannel(s) therein along the z-direction to exit the third heat transfer stage 108c via a pair of outlet channels 116a, 116b at opposite ends of the third heat transfer stage 108c.

The length of manifold channels can depend upon the application (e.g., desired heat transfer), type of working fluid (also referred to herein as coolant), etc. In some embodiments, the lengths of the manifold channels can be determined, for example, by experimentation, simulation, or both. In some embodiments, the length of the manifold channels can set a pitch of the respective heat transfer stage, for example, based on the amount of overlap between input channels (e.g., inlet channel(s) 110 or a connecting channel 112 acting as inlet for a particular stage) and output channels (e.g., outlet channel(s) 116 or a connecting channel 112 acting as an outlet for a particular stage). For example, in the illustrated example of FIG. 1C, the pitch of the first heat transfer stage 108a can be determined based on the sizes of the inlet channel 110 and the connecting channels 112a1, 112a2 (e.g., P1=the overlap between length, A, of the inlet channel 110 and length, B1, of the connecting channel(s) 112a along the x-direction). The pitch of the second heat transfer stage 108b can be determined based on the sizes of the connecting channels 112a1, 112a2 and the connecting channel 112b (e.g., P2=the overlap between length, B1, of the connecting channel(s) 112a and the length, B2, of the connecting channel(s) 112b along the x-direction). The pitch of the third heat transfer stage 108c can be determined based on the sizes of the connecting channel 112b (e.g., P3=the overlap between length, B2, of the connecting channel 112b and the length, C, of the outlet channel(s) 116 along the x-direction). In some embodiments, the sizes and/or number of the inlet channels, outlet channels, and/or connecting channels can vary across the manifold, for example, to adapt the pitch and/or number of heat transfer stages to a particular heat transfer application.

Figure 1D:
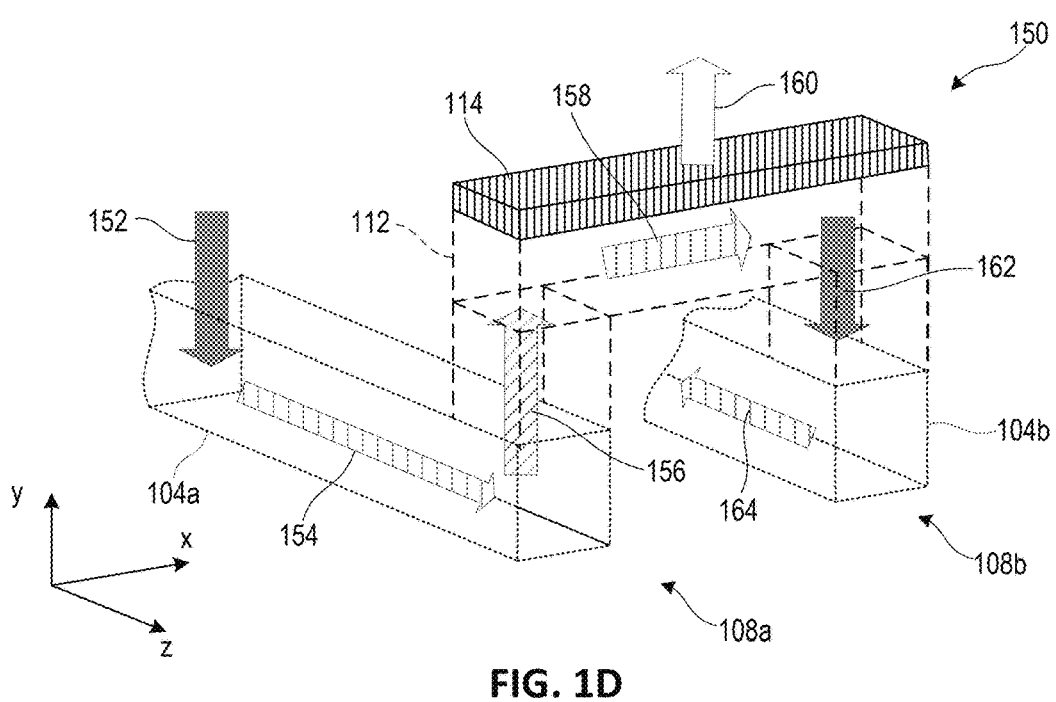
FIG. 1D is a simplified schematic of coolant flow in a unit cell of an MMC heat sink, according to one or more embodiments of the disclosed subject matter.

FIG. 1D shows a unit cell schematic 150 for coolant flow within a multi-stage, vapor-venting MMC heat sink. An inlet flow 152 of coolant (e.g., having a vapor quality less than 5%, for example, about 0%) is provided to microchannel 104a of a first heat transfer stage 108a. The coolant is heated as it flows along the length of the microchannel 104a, thereby evaporating at least some of the coolant in the flow 154. The coolant flow 156 thus exits the microchannel 104a of heat transfer stage 108a via connecting channel 112. In some embodiments, the exit coolant flow 156 can have a vapor quality greater than that of the inlet flow 152, for example, in a range of 5-25%. Vapor 160 within the coolant flow 158 within the connecting channel 112 can be removed via the vapor permeable membrane 114, such that the inlet flow 162 of coolant to the microchannel 104b of the next heat transfer stage 108b has a vapor quality less than that of the exit coolant flow 156. In some embodiments, the vapor removal by the vapor permeable membrane 114 can be effective to reset the vapor quality of the inlet flow 162 to substantially match that of the inlet flow 152 (e.g., having a vapor quality less than 5%, for example, about 0%). A similar coolant flow configuration may occur for each successive pair of heat transfer stages 108 similar to that illustrated by the unit cell schematic 150 of FIG. 1D.

Although connecting channel 112 is shown in FIG. 1D as having a vertically-extending portion (e.g., extending along the y-direction) connecting a horizontally-extending portion (e.g., extending along the x-direction) to the underlying microchannel 104a to receive the exit coolant flow 154 from stage 108a and another vertically-extending portion connecting the horizontally-extending portion to the underlying microchannel 104b to receive the inlet flow 162 entering into stage 108b, embodiments of the disclosed subject matter are not limited thereto. Indeed, in some embodiments, the connecting channel 112 may simply be a horizontally-extending portion capped at one end by the vapor permeable membrane 114 and disposed directly on or over upper faces of the underlying microchannels 104a, 104b (for example, in a manner similar to that illustrated in FIG. 2A).

In some embodiments, the connecting channel 112 can have a width (e.g., along the z-direction) that is greater than a width of the microchannels 104a, 104b (e.g., along the x-direction) in the respective stages 108a, 108b. For example, the width of the connecting channel 112 can be at least 10 times the respective width of the microchannels 104, 104b. In some embodiments, at least part of the connecting channel 112 can be bounded, defined, and/or formed by the vapor permeable membrane 114. In the illustrated example of FIG. 1D, the vapor permeable membrane 114 can form an uppermost wall (or at least a portion thereof) of the connecting channel 112. In the illustrated example of FIG. 1D, the connecting channel 112 connects together one of the microchannels 104a of stage 108a and another one of the microchannels 104b of stage 108b. However, in some embodiments, each connecting channel 112 may simultaneously connect together multiple microchannels of each stage (for example, as shown in FIG. 2A). In some embodiments, the connecting channel 112 can be formed as a recess open at opposite ends (e.g., along the y-direction), with one end being covered by the vapor permeable membrane 114 and the opposite end facing multiple microchannels (e.g., one or more microchannels 104a of the heat transfer stage 108a and one or more microchannels 104b of the adjacent heat transfer stage 108b).

MMC Heat Sinks

FIG. 2A illustrates a vapor-venting MMC heat sink 200, for example, having six successive heat transfer stages 208a-208f. In the illustrated example, the MMC heat sink 200 comprises a manifold 206 coupled to a parallel array 204 of microchannels. The manifold 206 includes a plurality of offset through-holes in fluid communication with the microchannels, thereby segregating the microchannels into respective heat transfer stages 208a-208f. A membrane 214 permeable only to vapor is placed over top of the manifold through-holes, thereby defining connecting channels 212 between successive heat transfer stages 208a-208f. Through-holes (or portions thereof) uncovered by the vapor-permeable membrane 214 at one end of the MMC heat sink 200 can define a coolant inlet region 210, while through-holes (or portions thereof) uncovered by the vapor-permeable membrane 214 at an opposite end of the MMC heat sink 200 can define a coolant outlet region 216. In the illustrated example, solid arrow 220 represents coolant in the liquid phase (e.g., having a vapor quality less than 5%, e.g., about 0%), open arrow 222 represents coolant in the vapor phase (e.g., having a vapor quality greater than 95%, e.g., about 100%), and dashed arrow 224 represents a mixture of coolant in the liquid and vapor phases (e.g., having a vapor quality of 5-25%).

In operation, coolant flow can enter the microchannels 204 of the first heat transfer stage 208a via one or more channels in the inlet region 210. Cooling to an underlying heat source can be provided by partly boiling the coolant flowing in the microchannels. The two-phase mixture then exits the microchannels of the first heat transfer stage 208a into the manifold 206, where the vapor, which is permeable to the membrane, escapes through the top. Meanwhile, coolant in the liquid is forced to enter the next stage 208b. This process continues until all of the heat transfer stages 208a-208f have been completed, for example, until the remaining coolant is exhausted from the MMC heat sink 200 via one or more channels in the outlet region 216.

In some embodiments, the net effect of the MMC heat sink configuration of FIG. 2A is the removal of the vapor and the resetting of the vapor quality to a low value (e.g., <5%, such as about 0%) after each stage. Thus, instead of operating all of the microchannels at a single exit vapor quality, each stage 208a-208f can operate at its own optimal vapor quality and its subsequent high heat transfer coefficient. In addition, because vapor is removed at each stage, the overall vapor quality at the global outlet will be significantly higher than the local vapor quality at each stage, and the latent heat of the fluid will be more fully utilized.

Figure 2B:
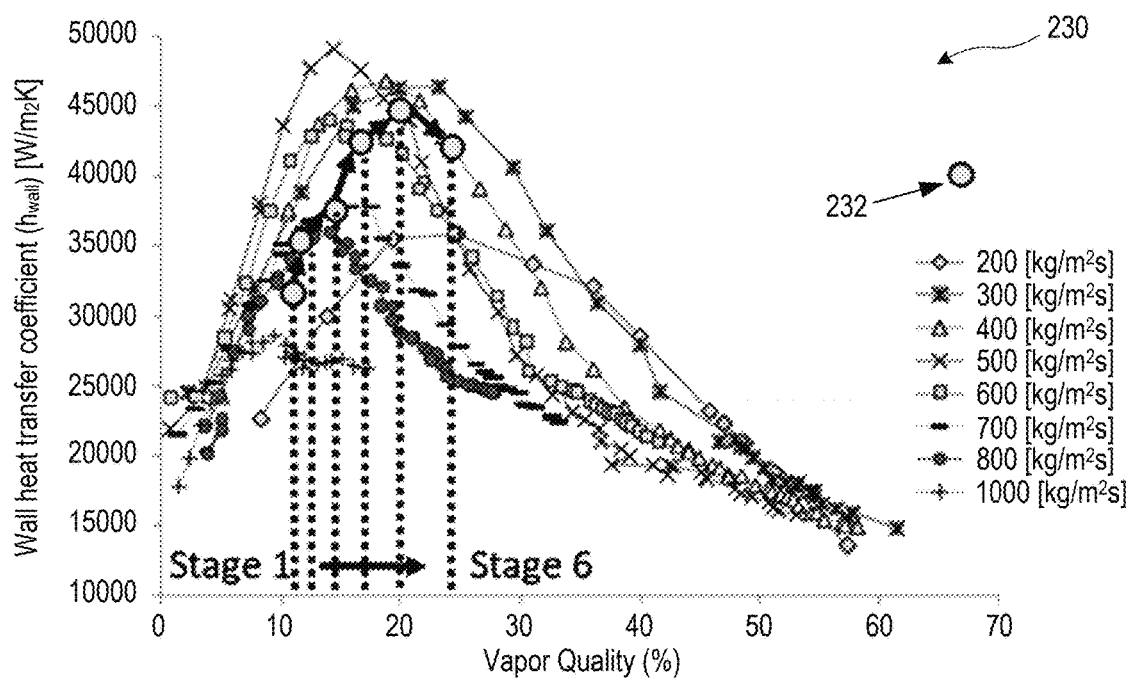
FIG. 2B is a graph of wall heat transfer coefficient versus vapor quality for operation of the heat sink of FIG. 2A.
Figure 3A:
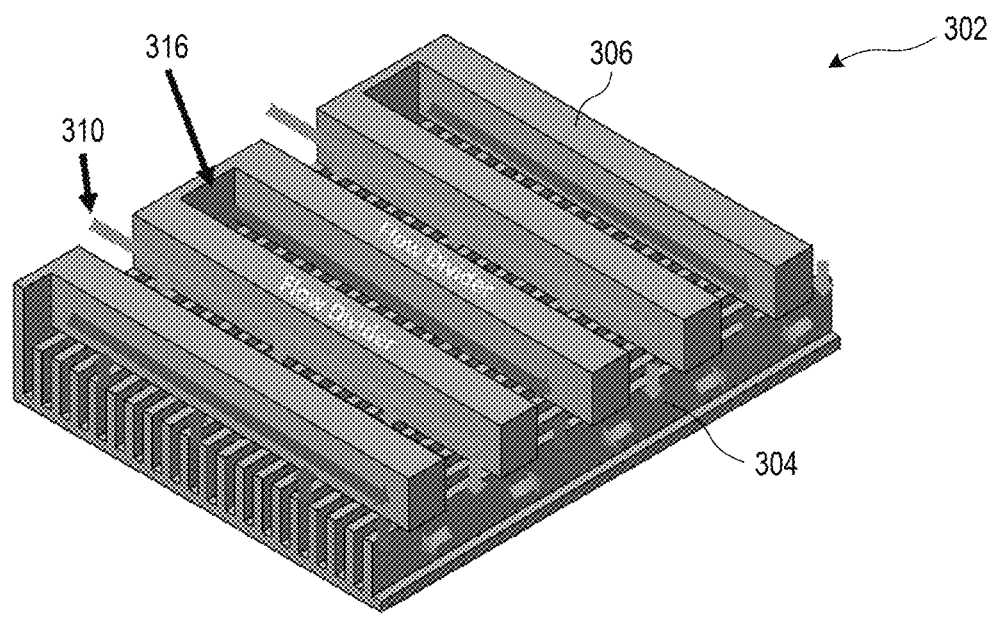
FIG. 3A is a partial cutaway perspective view of a conventional single-stage MMC heat sink.
Figure 3B:
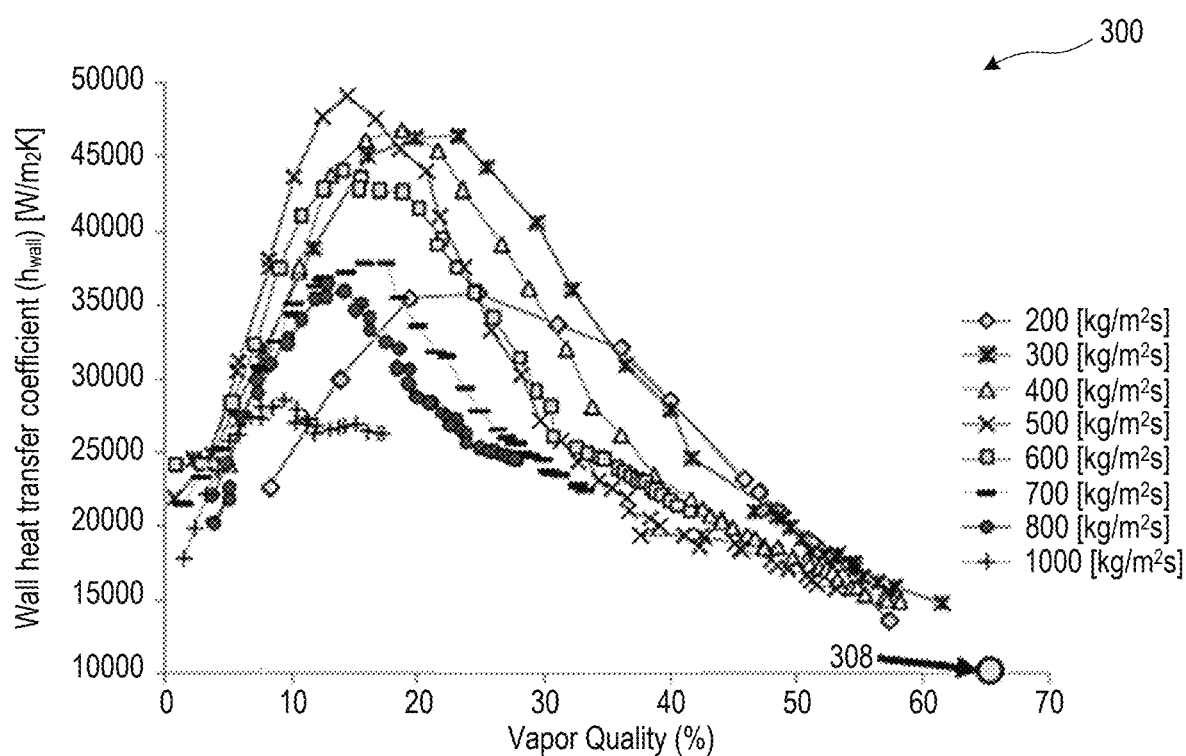
FIG. 3B is a graph of wall heat transfer coefficient versus vapor quality for operation of the heat sink of FIG. 3A.

FIG. 3B is a graph 300 of heat transfer coefficient versus exit vapor quality for the conventional single-stage MMC heat sink 302 of FIG. 3A. As shown in FIG. 3B, the conventional MMC heat sink 302 shows an optimal vapor quality between 10 and 25%, above which heat transfer coefficient decreases with increasing vapor quality. This limits the benefit of using two-phase cooling, since only 10-25% of the latent heat of the fluid is utilized. As a result, the overall vapor quality for an MMC heat sink 302 is rather high and the corresponding heat transfer coefficient is rather low, as shown at 308 in FIG. 3B. In contrast, the configuration of the multi-stage, vapor-venting MMC heat sink 200 enables improved heat transfer coefficients at higher overall exit vapor quality, for example, as shown at 232 in FIG. 2B.

The data of FIG. 2B was used to estimate system performance. If the base heat flux and mass flow rate entering the first stage is specified, the microchannel mass flux (G) can be computed from the geometry, and the outlet vapor quality can be computed from thermodynamics. The graph of FIG. 3B can be used to obtain the wall heat transfer coefficient using interpolation, and so, the performance of each stage can be predicted, as shown in FIG. 2B. The wall heat transfer coefficient can then be converted into an effective base heat transfer coefficient and surface superheat, and the temperature rise of the base can be computed. The amount of generated vapor can then be subtracted from the flow, and the new flow rate entered into the next stage, with the process repeating until all the stages have been evaluated. The results are summarized in Table 2.

TABLE 2

Predicted Performance of the Multi-Stage, Vapor-Venting MMC Heat Sink of FIG. 2A.

| Stage (#) | Mass Flow (g/s) | Mass Flux (kg/ m²-s) | Exit Vapor Quality | Pressure Drop (kPa) | Wall HTC (kW/ m²-K) | Base HTC (kW/ m²-K) | Temperature Rise (K) |
|---|---|---|---|---|---|---|---|
| 1 | 1 | 940 | 11% | 14.2 | 31 | 264 | 19 |
| 2 | 0.88 | 830 | 13% | 11.3 | 35 | 279 | 18 |
| 3 | 0.78 | 730 | 14% | 8.3 | 37 | 282 | 18 |
| 4 | 0.67 | 620 | 17% | 5.7 | 42 | 298 | 17 |
| 5 | 0.56 | 520 | 20% | 4.2 | 44 | 253 | 20 |
| 6 | 0.44 | 420 | 25% | 2.9 | 42 | 230 | 22 |
| Overall | 1 | — | 67% | 47 | 40 | 266 | 19 |

As shown in Table 2, the heat transfer coefficients at each stage are maintained above 200 kW/m²-K, since the local vapor quality exiting each stage is kept low (10-25%). However, the overall exit vapor quality is above 60%. If instead only one stage was used, the heat transfer coefficient would be very low, as shown in FIG. 3B.

In some embodiments, active means can be employed for controlling liquid flow, controlling vapor flow, and/or maintaining liquid on heat transfer surfaces within the microchannels of the MMC heat sink. In some embodiments, the active means can employ techniques such as but not limited to electrowetting, electroosmotic pumping, and electrohydrodynamics. For example, in some embodiments, an applied electric field can be used to improve heat transfer performance of the MMC heat sink and/or offer capability to serve as a booster when additional performance is required. For example, in some embodiments, a magnitude of an applied electric field or current can be increased to enhance performance. Alternatively or additionally, the active means can be used to drive liquid coolant to areas that require greater heat transfer (e.g., heat sources producing higher heat flux).

Figure 4A:
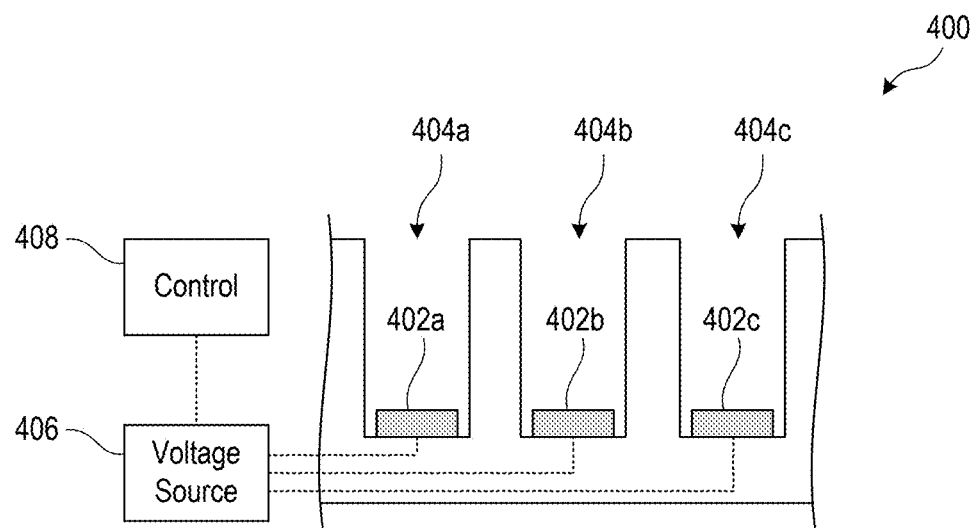
FIG. 4A is a simplified cross-sectional view of microchannels in an MMC heat sink employing active control, according to one or more embodiments of the disclosed subject matter.

For example, in some embodiments, portions of the microchannels can be formed of an electrically-conductive material or coated with an electrically-conductive material to form electrodes to provide in situ liquid/vapor control. In such embodiments, the manifold can be formed of an electrically-insulating material. For example, FIG. 4A illustrates an exemplary setup 400 for microchannels 404a-404c incorporating electrodes 402a-402c therein. Each electrode 402a-402c can be coupled to a voltage source 406. In some embodiments, a controller 408 can be operatively coupled to the voltage source 406 and can control operation thereof, for example, to apply an electric field within one or more of the microchannels 404a-404c via the respective electrodes 402a-402c.

In the examples of FIGS. 1A and 2A, the configuration of the MMC heat sink is such that the inlet is disposed at a first end of the plurality of microchannels and the outlet is disposed at an opposite second end of the plurality of microchannels. The heat transfer stages are thus laid out successively between the first and second ends. However, embodiments of the disclosed subject matter are not limited to such configurations. Rather, other configurations are also possible according to one or more contemplated embodiments.

Figure 4B:
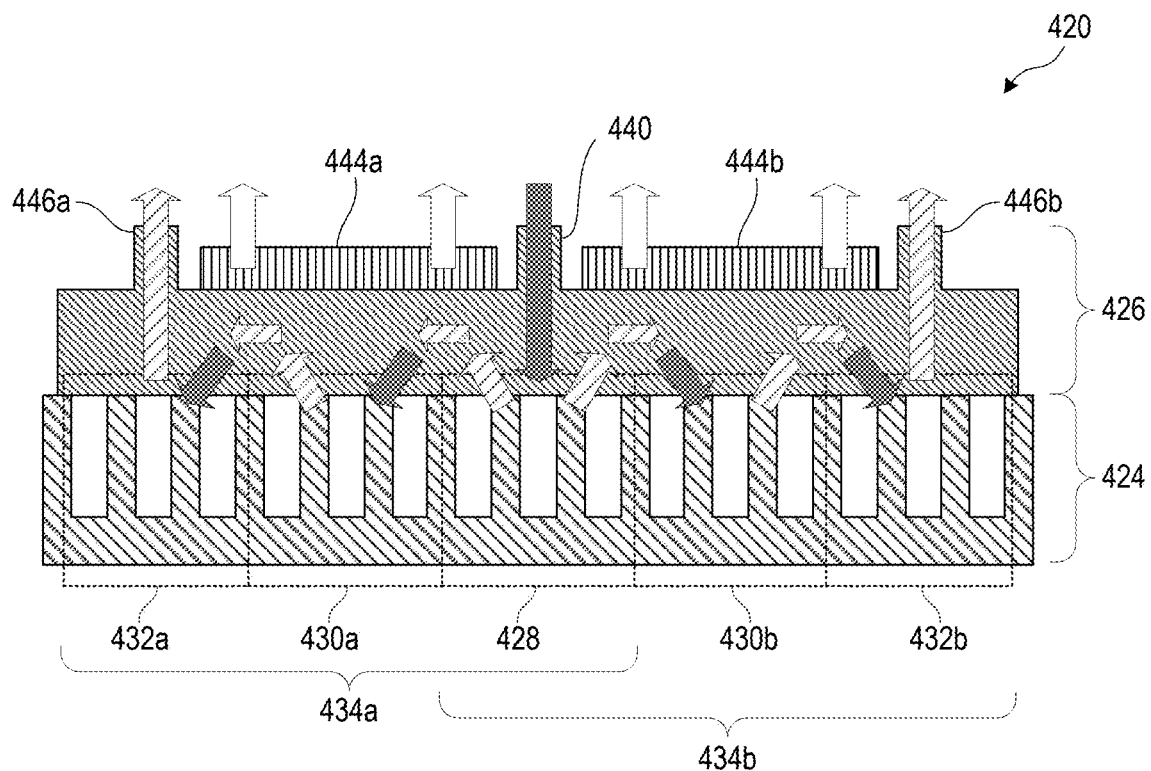
FIG. 4B is a simplified schematic diagram of a symmetric configuration for a multi-stage vapor-venting MMC heat sink, according to one or more embodiments of the disclosed subject matter.

In some embodiments, the MMC heat sink may have a symmetric stacked multi-stage configuration, for example, MMC heat sink 420 of FIG. 4B. In the illustrated example, the MMC heat sink 420 has an array of microchannels 424 coupled to a manifold 426. The manifold 426 can have one or more inlet channels 440 centrally disposed with respect to the microchannel array 424. The manifold 426 can also have one or more first outlet channels 446a at one end of the microchannel array 424 and one or more second outlet channels 446b at an opposite end of the microchannel array 424. The manifold 426 can also include connecting channels (not shown) coupled to respective vapor permeable membranes 444a, 444b. The manifold 426 can thus define a central inlet heat transfer stage 428, a pair of intermediate heat transfer stages 430a, 430b, and a pair of outlet heat transfer stages 432a, 432b. In contrast to the configuration of FIGS. 1A and 2A where the coolant flows between stages from one end of the microchannel array to the opposite end of the microchannel array, the coolant in the configuration of FIG. 4B flows from the centrally-located inlet stage 428 to opposite ends of the microchannel array 424, thereby defining symmetric first and second stacks 434a, 434b.

Figure 4C:
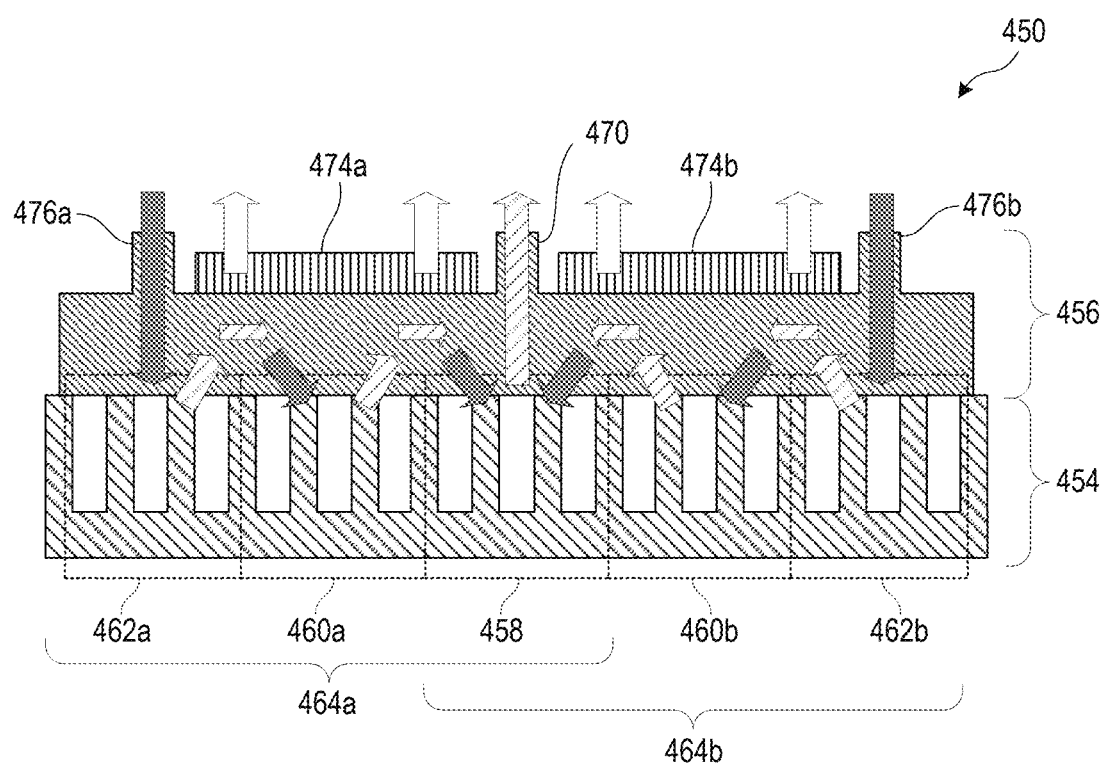
FIG. 4C is a simplified schematic diagram of another symmetric configuration for a multi-stage vapor-venting MMC heat sink, according to one or more embodiments of the disclosed subject matter.

FIG. 4C illustrates another MMC heat sink 450 having a symmetric stacked multi-stage configuration. In the illustrated example, the MMC heat sink 450 has an array of microchannels 454 coupled to a manifold 456. The manifold 456 can have one or more outlet channels 470 centrally disposed with respect to the microchannel array 454. The manifold 456 can also have one or more first inlet channels 476a at one end of the microchannel array 454 and one or more second inlet channels 476b at an opposite end of the microchannel array 454. The manifold 456 can also include connecting channels (not shown) coupled to respective vapor permeable membranes 474a, 474b. The manifold 456 can thus define a central outlet heat transfer stage 458, a pair of intermediate heat transfer stages 460a, 460b, and a pair of inlet heat transfer stages 462a, 462b. In contrast to the configuration of FIGS. 1A and 2A where the coolant flows between stages from one end of the microchannel array to the opposite end of the microchannel array, the coolant in the configuration of FIG. 4C flows from opposite ends of the microchannel array 454 to the centrally-located outlet stage 458, thereby defining symmetric first and second stacks 464a, 464b.

In some embodiments, the pitch of heat transfer stages (e.g., as defined by the manifold and/or size of the microchannels) can be varied between stages. In some embodiments, by appropriate design of the manifold and the channels therein, the respective pitch of each heat transfer stage to provide any desired combination of performance criteria, e.g., constant versus variable mass flux between stages, different versus the same exit vapor qualities at each stage, a higher overall exit vapor quality, etc. For example, in some embodiments, the manifold pitch can be decreased to counteract the reduced mass flow rate (e.g., due to removal of vapor between stages) in order to keep the mass flux constant between stages. This can allow for a selection of a mass flux that produces the highest heat transfer coefficient at a given heat flux, or alternatively, the optimal mass flux for the highest vapor quality at a given heat flux. In some embodiments, the use of a constant mass flux can yield a substantially identical heat transfer performance for all of the stages, thereby improving the surface temperature uniformity and/or maintaining a substantially constant pressure drop between stages. Alternatively or additionally, the configuration (e.g., the size, number, and/or location thereof) of inlet channels, outlet channels, and/or connecting channels can be custom designed to a particular application, for example, to direct more coolant to areas of higher heat flux.

Figure 4D:
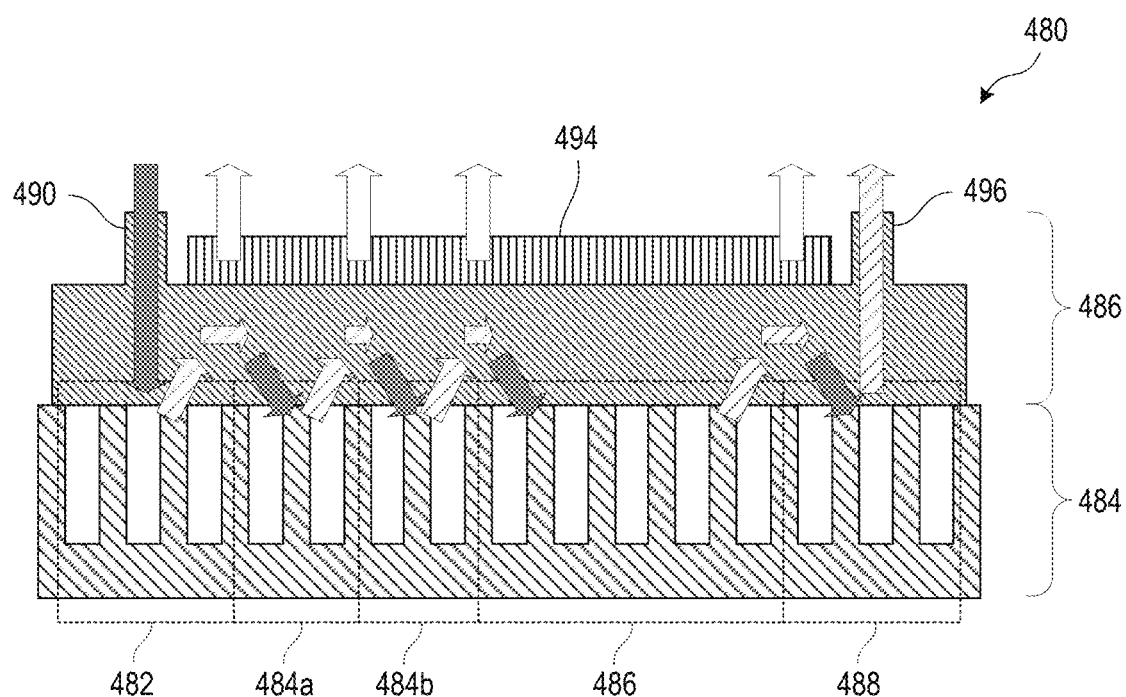
FIG. 4D is a simplified schematic diagram of a vapor-venting MMC heat sink with heat transfer stages of variable pitch, according to one or more embodiments of the disclosed subject matter.

For example, FIG. 4D illustrates an MMC heat sink 780 with heat transfer stages of different pitch. In the illustrated example, the MMC heat sink 780 has an array of microchannels 485 coupled to a manifold 487, which segregates the microchannels into successive heat transfer stages 482-488. The manifold 487 has one or more inlet channels 490 that provide coolant flow to an inlet stage 482, and one or more outlet channels 496 that remove coolant from the final outlet stage 488. A plurality of intermediate heat transfer stages 484-486 can be provided between the inlet stage 482 and the outlet stage 488. The manifold 487 can also include connecting channels (not shown) coupled to vapor permeable membrane 494 for removal of vapor between adjacent stages. In the illustrated example, intermediate stages 484*a*, 484*b* can have a small pitch (e.g., having two microchannels) as compared to the other stages, while intermediate stage 486 can have a large pitch (e.g., having five microchannels) as compared to the other stages. In some embodiments, the small-pitch heat transfer stages 484*a*, 484*b* can be disposed at locations corresponding to relatively high heat flux, and the large-pitch heat transfer stages 486 can be disposed at locations corresponding to relatively low heat flux.

Although FIGS. 1A-2A and 4A-4D illustrate particular configurations of MMC heat sinks, embodiments of the disclosed subject matter are not limited thereto. Rather, other configurations that employ multiple heat transfer stages of an MMC heat sink and vapor removal between at least some stages are also possible according to one or more contemplated embodiments.

MMC Heat Sink Methods

Figure 5:
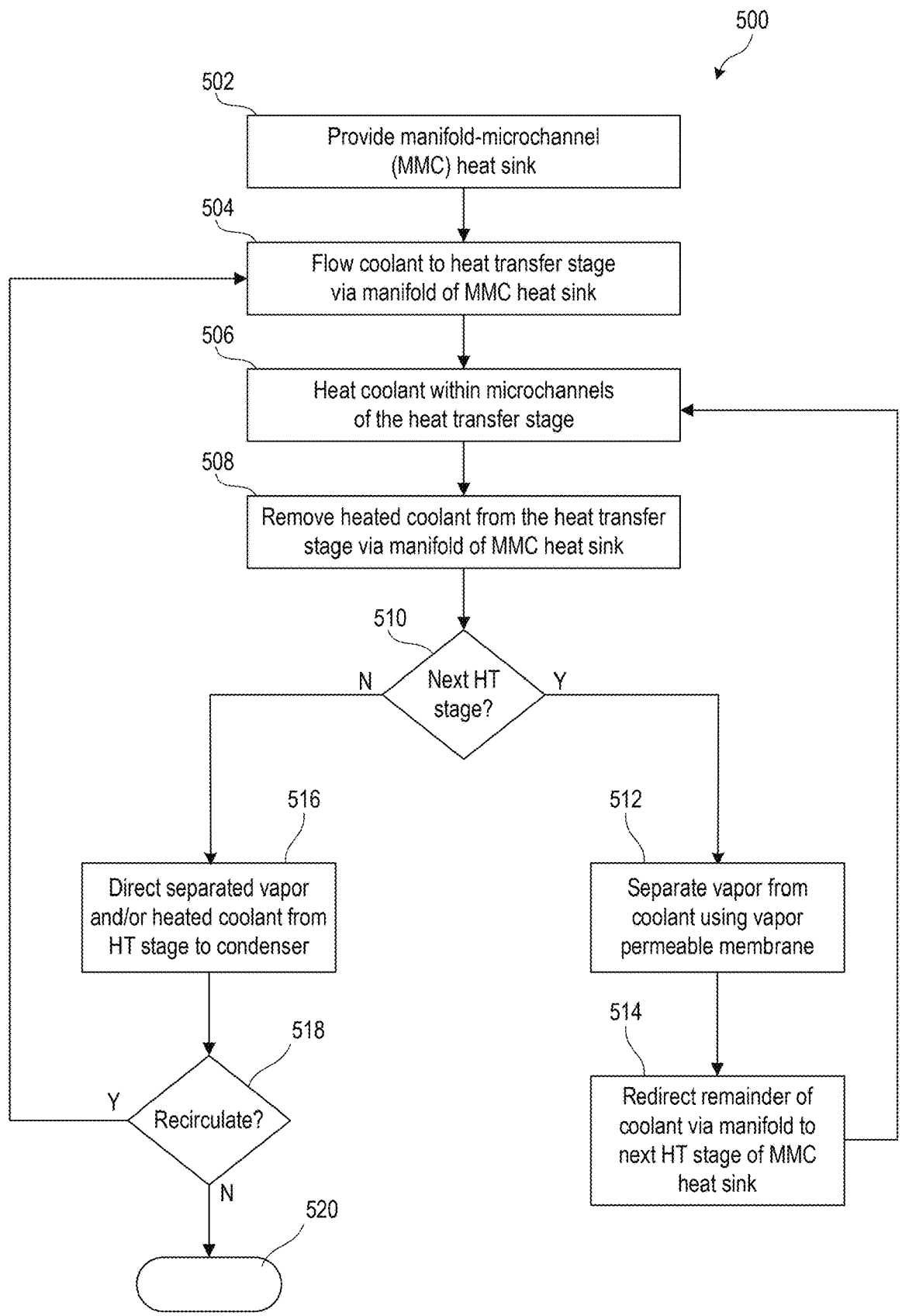
FIG. 5 is a process flow diagram illustrating a simplified method for provision and use of a multi-stage vapor-venting MMC heat sink, according to one or more embodiments of the disclosed subject matter.

FIG. 5 shows an exemplary method 500 for use of an MMC heat sink. The method 500 can begin at process block 502, where the MMC heat sink can be provided. In some embodiments, the provision of process block 502 can include coupling a manifold to a plurality of microchannels so as to segregate the microchannels into successive heat transfer stages. In some embodiments, the provision of process block 502 can include coupling one or more inlets of the MMC heat sink to a supply of coolant (e.g., a condenser and/or a pump). Alternatively or additionally, in the provision of process block 502 can include coupling one or more outlets of the MMC heat sink, for example, to an inlet of the condenser. In some embodiments, the provision of process block 502 can include thermally coupling a heat transfer surface of the MMC heat sink (e.g., a base microchannel surface) to one or more heat sources (e.g., one or more computer chips, one or more integrated circuit dies, one or more printed circuit boards, or any combination thereof). In some embodiments, the provision of process block 502 can include designing the MMC heat sink for a particular application. For example, the configuration (e.g., the size, number, and/or location thereof) of inlet channels, outlet channels, and/or connecting channels of the manifold, the number and/or pitch of heat transfer stages, the type of coolant, and/or the coolant flow rate can be selected according to the requirements of a cooling application.

The method 500 can proceed to process block 504, where coolant can be flowed to one or more microchannels of a heat transfer stage via the manifold of the MMC heat sink. In some embodiments, the coolant flowed to the heat transfer stage can have a vapor quality less than 5%, for example, about 0%. In some embodiments, each of the plurality of microchannels can extend along a first direction and have a respective width along a second direction perpendicular to the first direction. In some embodiments, the flowing of process block 504 can be along a direction substantially perpendicular to the first direction.

The method 500 can proceed to process block 506, where the coolant within the microchannel(s) of the heat transfer stage is heated, for example, to provide cooling to the coupled heat source. In some embodiments, the heating in process block 506 can be effective to heat the coolant with the microchannel(s) and/or to convert at least some of the coolant into the vapor phase. In some embodiments, during the heating of process block 506, the coolant can flow through the respective microchannel(s) along the first direction.

The method 500 can proceed to process block 508, where the heated coolant (e.g., a mixture of liquid and vapor phases) is flowed from the heat transfer stage via one or more connecting channels of the manifold of the MMC heat sink. In some embodiments, the coolant exiting from the heat transfer stage into the connecting channel(s) can have a first vapor quality, for example, in a range of 5-25%, inclusive. In some embodiments, the flowing of process block 508 can be in a plane substantially perpendicular to the first direction.

The method 500 can proceed to decision block 510, where it is determined if there is a subsequent heat transfer stage. If there is an additional heat transfer stage, the method 500 can proceed from decision block 510 to process block 512, where at least some vapor-phase coolant can be separated from liquid-phase coolant in the connecting channel(s) of the manifold via one or more vapor permeable membrane portions.

The method 500 can further proceed to process block 514, where the remaining coolant is redirected from the connecting channel(s) of the manifold to a next heat transfer stage of the MMC heat sink. In some embodiments, the coolant exiting from the connecting channel(s) into the next heat transfer stage can have a second vapor quality less than the first vapor quality. For example, the second vapor quality can be less than 5%, for example, about 0%. In some embodiments, the flowing of process block 514 can be in a plane substantially perpendicular to the first direction. The method 500 can then return to process block 506 for operation with the next heat transfer stage.

If there are no additional heat transfer stages, the method 500 can proceed from decision block 510 to process block 516, where the separated vapor (e.g., from one or more repetitions of process block 512) and/or heated coolant from the current heat transfer stage is directed to a condenser (e.g., to return the coolant into liquid form). In some embodiments, the coolant provided to the condenser in process block 516 can have an overall exit vapor quality of at least 25%, for example, at least 50%.

The method 500 can proceed to decision block 518, where it is determined if the coolant from the condenser should be recirculated. If recirculation is desired, the method 500 can return to process block 504 to repeat with the first heat transfer stage. Otherwise, the method 500 can optionally end at terminal block 520.

Although blocks 502-518 of method 500 have been described as being performed once, in some embodiments, multiple repetitions of a particular process block may be employed before proceeding to the next decision block or process block. In addition, although blocks 502-518 of method 500 have been separately illustrated and described, in some embodiments, process blocks may be combined and performed together (simultaneously or sequentially). Indeed, in some embodiments, at least process blocks 504-

518 can be performed simultaneously for multiple heat transfer stages, for example, during continuous operation of a multi-stage MMC heat sink. Moreover, although FIG. 5 illustrates a particular order for blocks 502-518, embodiments of the disclosed subject matter are not limited thereto. Indeed, in certain embodiments, the blocks may occur in a different order than illustrated or simultaneously with other blocks. In some embodiments, method 500 may comprise only some of blocks 502-520 of FIG. 5.

Computer Implementation

Figure 6:
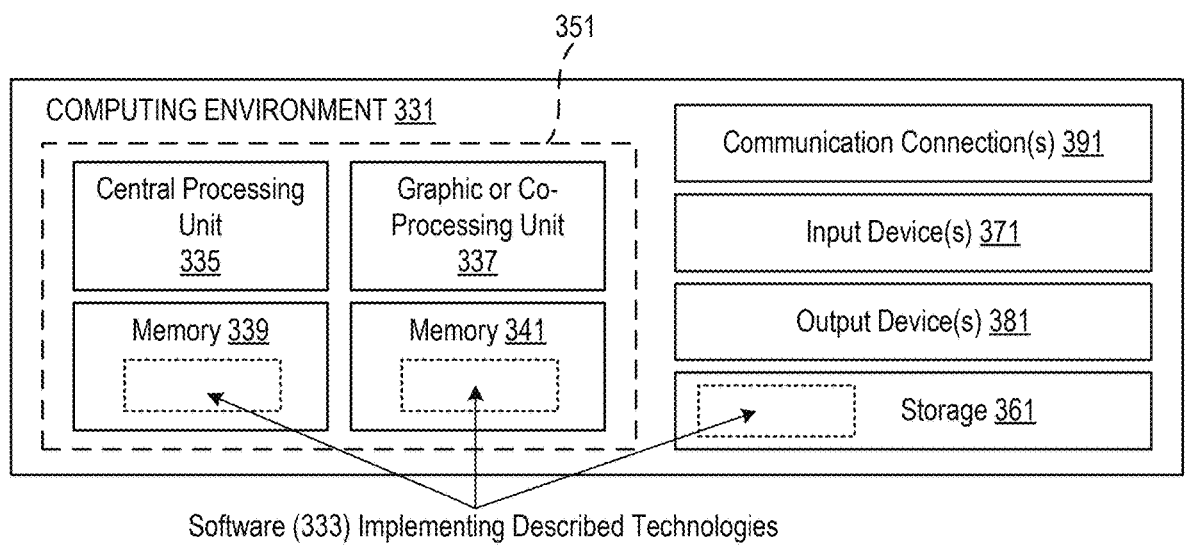
FIG. 6 depicts a generalized example of a computing environment in which the disclosed technologies may be implemented.

FIG. 6 depicts a generalized example of a suitable computing environment 331 in which the described innovations may be implemented, such as but not limited to aspects of controller 126, controller 408, voltage source 406, and/or method 500. The computing environment 331 is not intended to suggest any limitation as to scope of use or functionality, as the innovations may be implemented in diverse general-purpose or special-purpose computing systems. For example, the computing environment 331 can be any of a variety of computing devices (e.g., desktop computer, laptop computer, server computer, tablet computer, etc.).

With reference to FIG. 6, the computing environment 331 includes one or more processing units 335, 337 and memory 339, 341. In FIG. 6, this basic configuration 351 is included within a dashed line. The processing units 335, 337 execute computer-executable instructions. A processing unit can be a central processing unit (CPU), processor in an application-specific integrated circuit (ASIC), or any other type of processor (e.g., hardware processors, graphics processing units (GPUs), virtual processors, etc.). In a multi-processing system, multiple processing units execute computer-executable instructions to increase processing power. For example, FIG. 6 shows a central processing unit 335 as well as a graphics processing unit or co-processing unit 337. The tangible memory 339, 341 may be volatile memory (e.g., registers, cache, RAM), non-volatile memory (e.g., ROM, EEPROM, flash memory, etc.), or some combination of the two, accessible by the processing unit(s). The memory 339, 341 stores software 333 implementing one or more innovations described herein, in the form of computer-executable instructions suitable for execution by the processing unit(s).

A computing system may have additional features. For example, the computing environment 331 includes storage 361, one or more input devices 371, one or more output devices 381, and one or more communication connections 391. An interconnection mechanism (not shown) such as a bus, controller, or network interconnects the components of the computing environment 331. Typically, operating system software (not shown) provides an operating environment for other software executing in the computing environment 331, and coordinates activities of the components of the computing environment 331.

The tangible storage 361 may be removable or non-removable, and includes magnetic disks, magnetic tapes or cassettes, CD-ROMs, DVDs, or any other medium which can be used to store information in a non-transitory way, and which can be accessed within the computing environment 331. The storage 361 can store instructions for the software 333 implementing one or more innovations described herein.

The input device(s) 371 may be a touch input device such as a keyboard, mouse, pen, or trackball, a voice input device, a scanning device, or another device that provides input to the computing environment 331. The output device(s) 371 may be a display, printer, speaker, CD-writer, or another device that provides output from computing environment 331.

The communication connection(s) 391 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, radio-frequency (RF), or another carrier.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or any other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java™, Python®, and/or any other suitable computer language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means. In any of the above-described examples and embodiments, provision of a request (e.g., data request), indication (e.g., data signal), instruction (e.g., control signal), or any other communication between systems, components, devices, etc. can be by generation and transmission of an appropriate electrical signal by wired or wireless connections.

CONCLUSION

Any of the features illustrated or described herein, for example, with respect to FIGS. 1A-6, can be combined with any other feature illustrated or described herein, for example, with respect to FIGS. 1A-6 to provide configurations, systems, devices, structures, methods, and/or embodiments not otherwise illustrated or specifically described herein. All features described herein are independent of one another and, except where structurally impossible, can be used in combination with any other feature described herein. In view of the many possible embodiments to which the principles of the disclosed technology may be applied, it should be recognized that the illustrated embodiments are only examples and should not be taken as limiting the scope of the disclosed technology. Rather, the scope is defined by the following claims. Applicant therefore claims all that comes within the scope and spirit of these claims.

The invention claimed is:

1. A system comprising:
a manifold-microchannel (MMC) heat sink, the MMC heat sink comprising:
a plurality of microchannels constructed to carry a flow of coolant therein; and
a manifold coupled to the plurality of microchannels so as to segregate the microchannels into successive heat transfer stages, the manifold comprising:
at least one inlet channel coupled to a first of the heat transfer stages;
at least one outlet channel coupled to a second of the heat transfer stages;
at least one connecting channel, each connecting channel fluidically coupling an outlet of one of the heat transfer stages to an inlet of a successive one of the heat transfer stages; and
at least one vapor permeable membrane portion, each vapor permeable membrane portion being disposed along a corresponding one of the at least one connecting channel so as to be adjacent to the coolant as it flows from the outlet of the one of heat transfer stages to the inlet of the successive one of the heat transfer stages, and being constructed to allow the coolant in a vapor phase within said coolant flow to pass through the vapor permeable membrane portion to an outlet line while retaining the coolant in a liquid phase within the corresponding one of the at least one connecting channel,
wherein the MMC heat sink is constructed such that a vapor quality of the coolant exiting from one of the heat transfer stages via the respective outlet into a respective one of the at least one connecting channel is greater than a vapor quality of the coolant entering the successive one of the heat transfer stages via the respective inlet from the respective one of the at least one connecting channel.

2. The system of claim 1, wherein:
each of the plurality of microchannels extends along a first direction and has a width along a second direction perpendicular to the first direction; and
the manifold segregates the plurality of microchannels into the successive heat transfer stages along the second direction.

3. The system of claim 2, wherein:
the plurality of microchannels are arranged in an array; and
the first and the second of the heat transfer stages are formed at opposite ends of the array along the second direction.

4. The system of claim 2, wherein:
(a) for the first of the heat transfer stages, each of the at least one inlet channel is offset along the first direction from each of the at least one connecting channel coupled to the first of the heat transfer stages;
(b) for the second of the heat transfer stages, each of the at least one outlet channel is offset along the first direction from each of the at least one connecting channel coupled to the second of the heat transfer stages; or
both (a) and (b).

5. The system of claim 2, wherein:
each heat transfer stage between the first and second of the heat transfer stages along the second direction has multiple of the at least one connecting channel coupled thereto; and
at least one of the multiple connecting channels is offset along the first direction from at least another of the multiple connecting channels.

6. The system of claim 2, wherein the MMC heat sink is constructed such that the flow of coolant within each heat transfer stage to effect heat transfer is substantially along the first direction and the flow of coolant between heat transfer stages is in a plane substantially perpendicular to the first direction.

7. The system of claim 1, wherein:
each of the at least one outlet channel is fluidically coupled to the outlet line so as to combine the coolant flow from the second of the heat transfer stages and the coolant in the vapor phase from the at least one vapor permeable membrane portion, thereby forming a combined outlet flow, and
the MMC heat sink is constructed to provide an overall exit vapor quality for the combined outlet flow of at least 25%.

8. The system of claim 7, wherein the MMC heat sink is constructed to provide an overall exit vapor quality for the combined outlet flow of at least 50%.

9. The system of claim 7, wherein the MMC heat sink is constructed such that the vapor quality of the coolant entering the inlet of each successive heat transfer stage is less than 5%.

10. The system of claim 9, wherein the MMC heat sink is constructed such that the vapor quality of the coolant entering the inlet of each successive heat transfer stage is about 0%.

11. The system of claim 9, wherein the MMC heat sink is constructed such that the vapor quality of the coolant exiting from the outlet of each heat transfer stage into a respective one of the at least one connecting channel is in a range of 5-25%, inclusive.

12. The system of claim 1, wherein:
the manifold segregates the microchannels into at least three successive heat transfer stages; and
each heat transfer stage is comprised of more than one of the plurality of microchannels.

13. The system of claim 1, wherein a pitch of at least one of the heat transfer stages is different than that of another of heat transfer stages.

14. The system of claim 13, wherein the pitch of each of the heat transfer stages is such that a mass flux of the coolant within each of the heat transfer stages is substantially the same.

15. The system of claim 1, further comprising:
a condenser fluidically coupled to the MMC heat sink so as to receive coolant from the outlet line and the at least one outlet channel, and to provide coolant to the at least one inlet channel, the condenser being configured to condense the coolant in the vapor phase received from the MMC heat sink and to provide the coolant in the liquid phase to the at least one inlet channel of the MMC heat sink.

16. The system of claim 1, further comprising:
electrodes disposed within or coupled to one or more of the plurality of microchannels; and
a voltage source coupled to the electrodes and configured to apply a voltage to the electrodes so as to urge the coolant in the liquid phase toward heat transfer surfaces of the one or more of the plurality of microchannels.

17. The system of claim 1, wherein:
a surface of the MMC heat sink opposite the manifold is configured to be coupled to a plurality of heat sources; and
the MMC heat sink is constructed to provide (i) at least 100 W/cm$^2$ of heat flux for the plurality of heat sources and/or (ii) at least 5 kW/cm$^2$ of heat flux for at least one of the plurality of heat sources.

18. The system of claim 1, wherein:
each connecting channel comprises a first open end facing multiple microchannels and a second open end facing the corresponding vapor permeable membrane portion, and
the first open end serves as the outlet of the one of the heat transfer stages and the inlet of the successive one of the heat transfer stages.

19. A method comprising:
(a) flowing coolant in a liquid phase to an inlet of a heat transfer stage of a manifold-microchannel (MMC) heat sink, the MMC heat sink comprising a plurality of microchannels and a manifold coupled to the plurality of microchannels so as to segregate the microchannels into successive heat transfer stages, the manifold comprising at least one inlet channel coupled to a first of the heat transfer stages, at least one outlet channel coupled to a second of the heat transfer stages, at least one connecting channel, and at least one vapor permeable membrane portion, each connecting channel fluidically coupling an outlet of one of the heat transfer stages to an inlet of a successive one of the heat transfer stages, each vapor permeable membrane portion being disposed along a corresponding one of the at least one connecting channel so as to be adjacent to the coolant as it flows from the outlet of the one of the heat transfer stages to the inlet of the successive one of the heat transfer stages;
(b) heating the coolant within one or more microchannels of the heat transfer stage so as to convert at least some of the coolant therein into a vapor phase;
(c) flowing the coolant from the heat transfer stage into a connecting channel between the outlet of the heat transfer stage and the inlet of the successive heat transfer stage, the coolant from the heat transfer stage having a first vapor quality;
(d) removing, via the vapor permeable membrane portion, at least some of the coolant in the vapor phase from the flow in the connecting channel to an outlet line while retaining the coolant in a liquid phase within the connecting channel, such that the coolant remaining in the connecting channel has a second vapor quality less than the first vapor quality;
(e) flowing the coolant from the connecting channel into the inlet of the successive heat transfer stage of the MMC heat sink; and
(f) heating the coolant within one or more microchannels of the successive heat transfer stage so as to convert at least some of the coolant therein into the vapor phase.

20. The method of claim 19, wherein:
each of the plurality of microchannels extends along a first direction and has a width along a second direction perpendicular to the first direction;
during the heating of (b) and/or the heating of (f), the coolant flows through the respective one or more microchannels along the first direction; and
the coolant flows, via the connecting channel, between the heat transfer stage and the successive heat transfer stage along the second direction.

* * * * *